(12) United States Patent
Satoh

(10) Patent No.: US 7,119,014 B2
(45) Date of Patent: Oct. 10, 2006

(54) METHOD FOR FABRICATING A SEMICONDUCTOR DEVICE HAVING A TAPERED-MESA SIDE-WALL FILM

(75) Inventor: Yoshihiro Satoh, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 13 days.

(21) Appl. No.: 10/642,667

(22) Filed: Aug. 19, 2003

(65) Prior Publication Data
US 2004/0038508 A1 Feb. 26, 2004

(30) Foreign Application Priority Data
Aug. 20, 2002 (JP) .............. 2002-239455

(51) Int. Cl.
*H01L 21/44* (2006.01)
(52) U.S. Cl. ............. 438/671; 438/945; 438/946; 438/597; 257/E21.002
(58) Field of Classification Search ........... 438/671, 438/945, 946, 597
See application file for complete search history.

(56) References Cited

U.S. PATENT DOCUMENTS 5,773,341 A * 6/1998 Green et al. .............. 438/253
5,981,356 A * 11/1999 Hsueh et al. .............. 438/424
6,235,620 B1 * 5/2001 Saito et al. ................ 438/586
6,576,509 B1 * 6/2003 Toyokawa et al. ......... 438/253

FOREIGN PATENT DOCUMENTS

CN 1246727 A 3/2000
JP 2000-31277 1/2000

OTHER PUBLICATIONS

Chinese Office Action dated Sep. 23, 2005 with an English translation.

* cited by examiner

Primary Examiner—Zandra V. Smith
Assistant Examiner—Christy Novacek
(74) Attorney, Agent, or Firm—McGinn IP Law Group, PLLC

(57) ABSTRACT

A method for fabricating a semiconductor memory device includes the consecutive steps of consecutively depositing metallic, nitride and oxide films on an underlying insulating film, patterning the nitride and oxide films to allow the oxide film to have a patterned area smaller than the patterned area of the nitride film, patterning the metallic film by using the nitride and oxide films as a mask, forming a side-wall film having a tapered mesa structure on the oxide, nitride and metallic films, embedding the side-wall oxide film by an interlayer dielectric film, and forming a contact hole in the interlayer dielectric film and the underlying oxide film while using the side-wall oxide film as an etch stopper.

26 Claims, 7 Drawing Sheets

METHOD FOR FABRICATING A SEMICONDUCTOR DEVICE HAVING A TAPERED-MESA SIDE-WALL FILM

BACKGROUND OF THE INVENTION (a) Field of the Invention

The present invention relates to a method for fabricating a semiconductor device having a tapered-mesa side-wall film, and more particularly, to an improvement of the structure of an interlayer dielectric film embedding therein an interconnection layer.

(b) Description of the Related Art

A multi-layer interconnection structure is generally employed in conventional semiconductor devices, such as a DRAM, for reducing the occupied area of the semiconductor devices. The multi-layer interconnection structure increases the integration density of the semiconductor device in association with the fine fabrication processes. The resultant semiconductor devices having a higher integration density generally have a higher aspect ratio and a smaller distance between each adjacent two of the interconnects due to the smaller dimensions of the devices in the horizontal directions.

FIGS. 3A to 3E show consecutive fabrication steps of a process for fabricating a conventional multi-layer interconnection structure by using a two-layer hard mask. A metallic conductive layer 11a is first deposited on an underlying silicon oxide film 10, followed by deposition of the two-layer hard mask including an insulator film 12 and a silicon oxide film (oxide film) 13 consecutively as viewed from the bottom. The insulator film 12 may be a silicon nitride film (nitride film) having a sufficient etch selectivity relative to the oxide film 13. A photoresist film is then formed on the oxide film 13 by coating, followed by patterning thereof to obtain a photoresist pattern 14. The insulator film 12 and oxide film 13 are then etched by using the photoresist pattern 14 as a mask, to obtain the structure of FIG. 3A.

Subsequently, the photoresist pattern 14 is removed, followed by etching the metallic conductive film 11a to configure bit lines 11 having a specified width by using the insulator film 12 and oxide film 13 as a mask, as shown in FIG. 3B. Thereafter, as shown in FIG. 3C, another insulator film 15 is deposited on the entire surface, followed by etch-back thereof to configure side-wall films 16 on the bit lines 11a and corresponding insulator films 12, as shown in FIG. 3D. After this etching step, a portion of the oxide film 13 may be left on the insulator film 12, as illustrated by the dotted line in FIG. 3D.

After forming the side-wall film 16, an interlayer dielectric film 17 is deposited to entirely embed therein the bit lines 11, insulator films 12 and side-wall films 16, as shown in FIG. 3E. It is to be noted that a defect, or void, is formed in the interlayer dielectric film 17 between side-wall films 16 (or bit lines 11). The void is likely to occur in the case of a smaller distance between the bit lines 11 and the case of a higher aspect ratio of the insulator films 12 and side-wall films 16. In other words, a defective embedding structure of the interlayer dielectric film 17 may occur in the case of a smaller distance between the adjacent side-wall films 16 and a larger depth of the side-wall films 16.

The two-layer hard mask may be replaced by a single-layer hard mask for patterning the bit lines 11. FIGS. 4A to 4F show consecutive fabrication steps of another process using the single-layer hard mask in another conventional technique.

A metallic conductive film 11a and an insulator film 12 are consecutively formed on an underlying oxide film 10. Thereafter, a photoresist film is formed on the insulator film 12 by coating, followed by patterning thereof to form a photoresist pattern 14. By using the photoresist pattern as an etching mask, the insulator film 12 is etched, as shown in FIG. 4A. After removing the photoresist pattern 14, the metallic conductive film 11a is then patterned using the insulator film 12 as a mask to configure bit lines 11 having a specified width just under the insulator film 12, as shown in FIG. 4B. An insulator film 15 is then deposited on the entire surface, as shown in FIG. 4C, followed by etch-back thereof to configure side-wall films 16 on both sides of the bit line 11 and the insulator film 12, as shown in FIG. 4D.

After the etch-back step, the insulator film 12 on the bit line 11 has a reduced thickness compared to the case using the two-layer hard mask, as illustrated by the dotted line in FIG. 4D. Subsequently, an interlayer dielectric film 17 is deposited to embed therein the insulator films 12 and the side-wall films 16, as shown in FIG. 4E. In this case using the single-layer hard mask, since the space between adjacent side-wall films 16 has a smaller depth, the defective embedding structure of the interlayer dielectric film such as encountered in the case of the two-layer hard mask is less involved in this case.

After forming the interlayer dielectric film 17, the interlayer dielectric film 17 is etched while using the insulator film 12 and the side-wall films 16 as an etch stopper in an self-alignment etching technique in order to form a contact hole for receiving therein a contact, i.e., self-aligned contact, for a capacitor between the bit lines 11. In this case of the single-layer hard mask, there may arise a problem that a short-circuit failure occurs between the self-aligned contact and one of the bit lines 11, as illustrated in FIG. 4F, due to the insufficient thickness of the insulator film 12 which may cause an exposed surface of the bit lines 11 during after self-alignment etching.

It is to be noted that a defective embedding structure of the interlayer dielectric film is more likely to occur along with the development of the finer patterning process to reduce the space between adjacent interconnect lines. As described above, the two-layer hard mask causes the defective embedding structure due to the increased aspect ratio, wherein the space between the adjacent side-wall films has a larger depth. On the other hand, the single-layer hard mask may cause a short-circuit failure due to reduction of the thickness of the insulator film and thus reduction of the etching margin during etching for the contact hole receiving therein the self-aligned contact, although there is some improvement in the embedding structure itself.

Patent Publication JP-A-2000-31277 describes an improvement in the embedding structure formed by using the single-layer hard mask, wherein the embedding interlayer dielectric film is formed after removing the top corners of the insulator film on an aluminum interconnect line. The described technique can reduce the effective aspect ratio by increasing the space between the adjacent insulator films in the vicinity of the top thereof due to the removal of the top corners of the dielectric film. However, this technique does not solve the above problem of the short-circuit failure because the reduced thickness of the insulator film reduces the etch margin during etching for the self-aligned contact hole.

SUMMARY OF THE INVENTION

In view of the above problems in the conventional techniques, it is an object of the present invention to provide a method for fabricating a semiconductor device having an improved embedding structure of the interlayer dielectric film and preventing the short-circuit failure after forming a contact between interconnect lines, while using a two-layer hard mask for patterning the interconnect lines.

The present invention provides, in one aspect thereof, a method for fabricating a semiconductor device including the consecutive steps of: depositing a metallic conductive film on an underlying insulating film; consecutively depositing first and second insulator films on the metallic conductive film; patterning the first and second insulator films to have a substantially same patterned area; etching the second insulator film selectively from the first insulator film to configure the second insulator film to have a width smaller than a width of the first insulator film; patterning the metallic conductive film by using the first and second insulator films; depositing a third insulator film on the first and second insulator films and the underlying insulating film; etching-back the third insulator film to configure a side-wall film covering at least the patterned metallic oxide film; and depositing a fourth insulator film over an entire area to embed therein the side-wall oxide film.

In accordance with the method of the present invention, since the side-wall film has a tapered mesa structure wherein the top portion of the side-wall film has a smaller width compared to the bottom portion thereof, the aspect ratio of the space between the side-wall films of the adjacent interconnect lines can be reduced for deposition of the fourth insulator films, whereby a defect of void can be prevented in the fourth insulator film without decreasing the thickness of the first insulator film. The structure of the semiconductor device fabricated by the present invention is suited to a semiconductor memory device having a capacitor contact hole, which is formed in self-alignment etching process using the first insulator film and the side-wall film as an etch stopper.

The above and other objects, features and advantages of the present invention will be more apparent from the following description, referring to the accompanying drawings.

PREFERRED EMBODIMENTS OF THE INVENTION

Figure 1A:
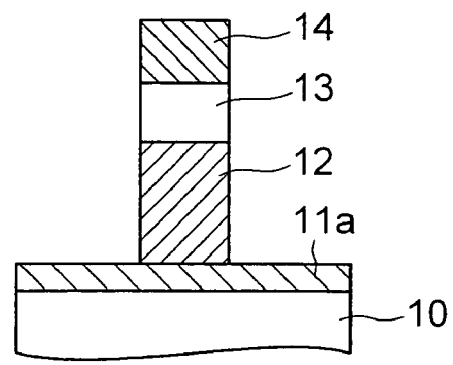
FIGS. 1A to 1G are sectional views of a semiconductor device during consecutive steps of a fabrication process thereof according to a first embodiment of the present invention.

Now, the present invention is more specifically described with reference to accompanying drawings, wherein similar constituent elements are designated by similar reference numerals throughout the drawings for a better understanding of the present invention.

Referring to FIGS. 1A to 1G, there is shown a method for fabricating a semiconductor device according to a first embodiment of the present invention. Roughly, the method of the present embodiment uses a two-layer hard mask for patterning bit lines, and deposits an interlayer dielectric film after protecting the patterned bit lines by using a side-wall oxide film having a tapered mesa structure.

A metallic conductive film 11a is first formed on an underlying oxide film 10, followed by forming thereon a two-layer hard mask including an insulator film 12 and an oxide film 13 consecutively as viewed from the bottom. The metallic conductive film 11a may include tungsten. A photoresist film is formed on the oxide film 13 by coating, followed by patterning the photoresist film to form a photoresist pattern 14. By using the photoresist pattern as a mask, the insulator film 12 and oxide film 13 are patterned by etching, as shown in FIG. 1A, to have a substantially same patterned area. The insulator film 12 may be a nitride film, for example, which has a sufficient etch selectivity relative to the oxide film 13.

Figure 1B:
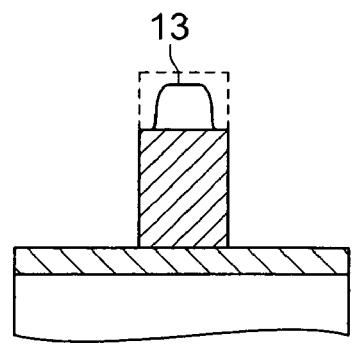
Figure 1C:
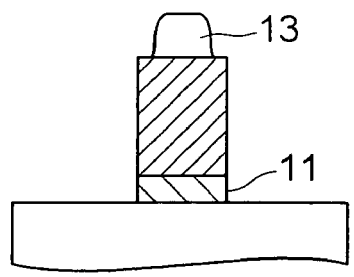

Thereafter, the photoresist pattern 14 is removed, followed by wet etching the oxide film 13 in a desired amount by using an etchant such as diluted hydrofluoric acid (DHF) or buffered hydrofluoric acid (BHF), as shown in FIG. 1B. After this step, the resultant oxide film 13 has a smaller patterned area, i.e., smaller width, than the insulator film 12. Thereafter, the metallic conductive film 11a is patterned by etching using the oxide film 13 and the insulator film 12 as an etching mask, to configure bit lines 11 each having a specified width equal to the width of the insulator film 12, as shown in FIG. 1C.

Figure 1D:
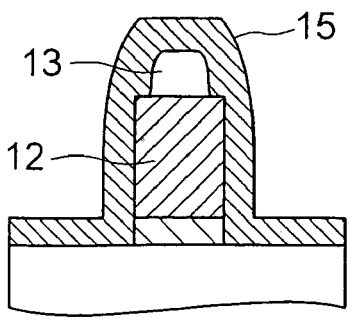

Subsequently, another insulator film 15 is deposited on the entire surface, as shown in FIG. 1D, including the oxide film 13, insulator film 12, bit lines 11 and the underlying oxide film 10. The portion of the resultant insulator film 15 covering the oxide film 13, insulator film 12 and bit line 11 has a tapered mesa structure, wherein the insulator film has a larger width in the vicinity of the underlying oxide film 10 than in the vicinity of the oxide film 13. The shape of the tapered mesa structure can be adjusted by selecting the thickness of the oxide film 13, the etching time for wet etching of the oxide film 13 etc.

Figure 1E:
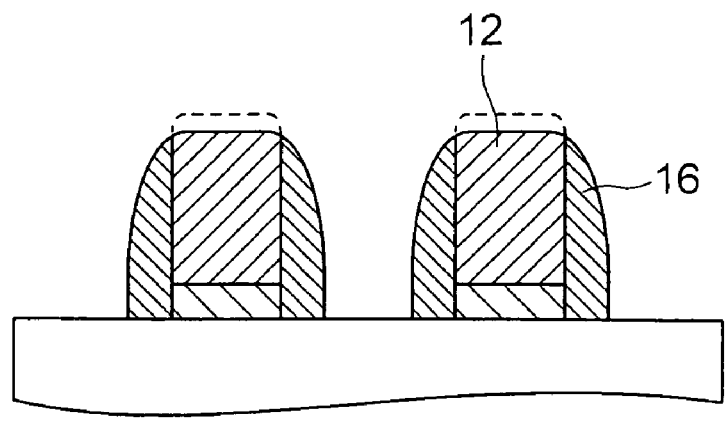
Figure 1F:
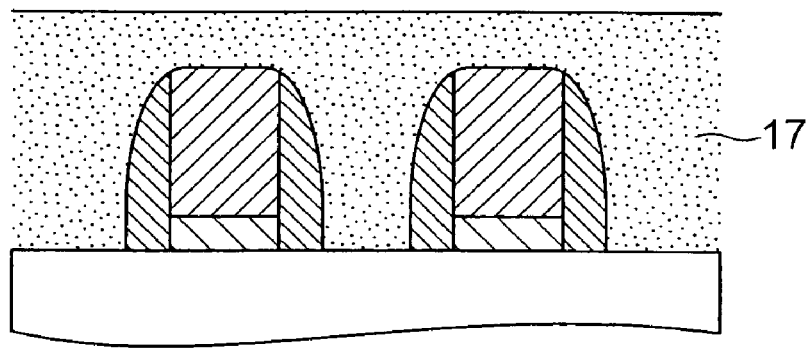
Figure 1G:
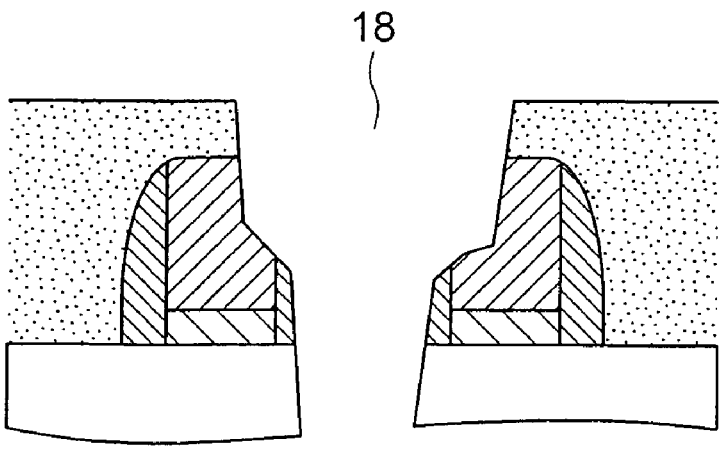
Figure 2A:
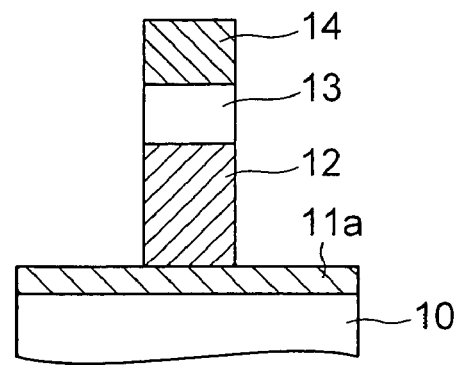
FIGS. 2A to 2G are sectional views of a semiconductor device during consecutive steps of a fabrication process thereof according to a second embodiment of the present invention.
Figure 2B:
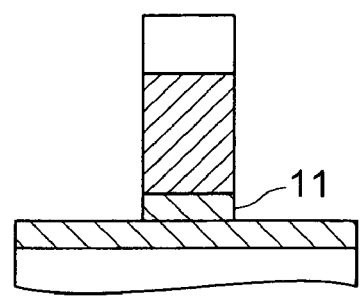
Figure 2C:
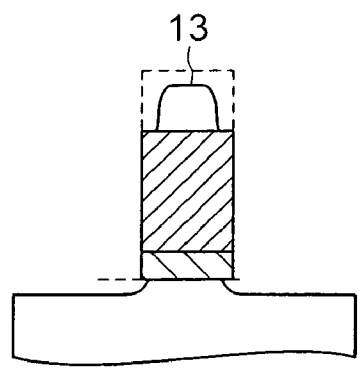
Figure 2D:
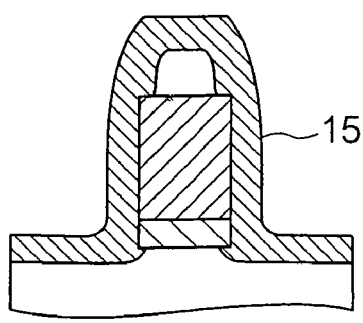

The etch-back of the deposited insulator film 15 provides a side-wall film 16 covering the side surfaces of the insulator film 12 and the bit line 11, as shown in FIG. 1E. At this step, a portion of the oxide film 13 may be left on the insulator film 12. Thereafter, an interlayer dielectric film 17 is deposited as by using a high-density-plasma-enhanced CVD technique to embed therein the insulator film 12 and the side-wall film 16, as shown in FIG. 1F. Further, a contact hole 18 is formed between adjacent bit lines 11 by etching the interlayer dielectric film 17 and the underlying oxide film 10, while using a self-alignment etching technique wherein the insulator film 12 and the side-wall film 17 are used as an etch stopper, the contact hole 18 receiving therein a capacitor contact, as shown in FIG. 2G.

In the present embodiment, as described above, the bit line 11 is patterned using a two-layer hard mask including the insulator film 12 and the oxide film 13 as an etching mask. After the etch-back of the oxide film 13 selectively from the insulator film 12, the insulator film 15 is deposited on the entire surface and etched-back to form a side-wall film 16 for the bit line 11. In such a configuration, since a sufficient thickness is secured for the thickness of the insulator film 12 on the bit line 11 due to the use of the two-layer hard mask, a short-circuit failure scarcely occurs between each of the bit lines 11 and the capacitor contact formed after the etching for the self aligned contact hole.

In addition, since the side-wall film 16 has a tapered mesa structure, the top portion of the contract hole in the interlayer dielectric film 17 is larger compared to bottom portion thereof in the vicinity of the bit lines 11, a defective embedding structure can be suppressed in the deposition of the interlayer dielectric film 17 to prevent a "pair bit failure" in a semiconductor memory device. The pair bit failure often encountered in a conventional semiconductor memory device is such that a pair of bit lines used for a column of memory cells and having a smaller space therebetween suffers from a defect of a short-circuit failure due to the contact disposed between the pair of bit lines.

Referring to FIGS. 2A to 2G, there is shown a method for fabricating a semiconductor device according to a second embodiment of the present invention. The second embodiment is similar to the first embodiment except that the oxide film 13 is etched after patterning the bit lines 11 in the second embodiment.

More specifically, metallic conductive film 11a, insulator film 12 and oxide film 13 are consecutively deposited on an underlying oxide film 10. A photoresist film is then formed on the oxide film 13 by coating, followed by patterning thereof to form a photoresist pattern 14. Subsequently, the insulator film 12 and oxide film 13 are patterned by etching while using the photoresist patter as a mask, thereby configuring the insulator film 12 and oxide film 13 to have a substantially same patterned area, as shown in FIG. 2A.

Thereafter, the photoresist pattern 14 is removed, and the metallic conductive film 11a is patterned by etching, using the oxide film 13 and insulator film 12 as a mask, to thereby configure bit lines 11 having a specified width. Wet etching is then conducted to etch the oxide film 13 in a specified amount, as shown in FIG. 1C, wherein the oxide film 13 has a reduced patterned area compared to the insulator film 12. In other words, the oxide film 13 has a smaller width than the insulator film 12. In addition, a surface portion of the underlying oxide film 10 is also removed by the wet etching. An insulator film 15 is then deposited over the entire surface as shown in FIG. 2D. The portion of the insulator film 15 covering the bit line 11 has a tapered mesa structure, wherein the insulator film 15 has a smaller width in the vicinity of the oxide film 13 than in the vicinity of the underlying oxide film 10.

Figure 2E:
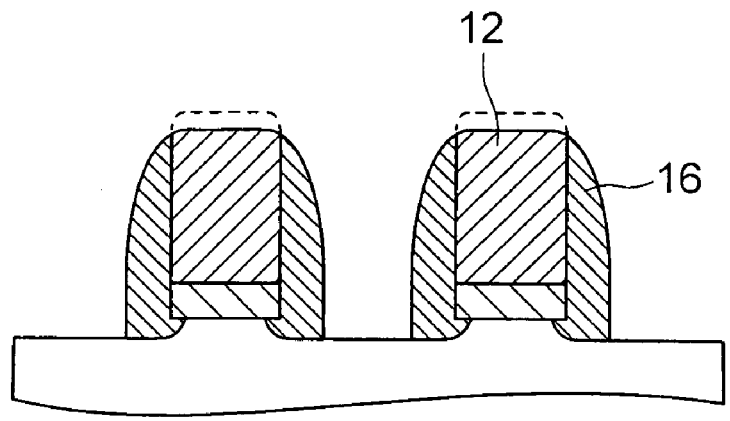
Figure 2F:
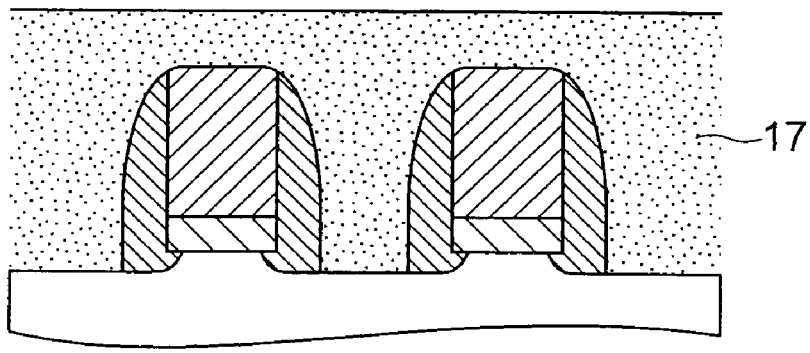
Figure 2G:
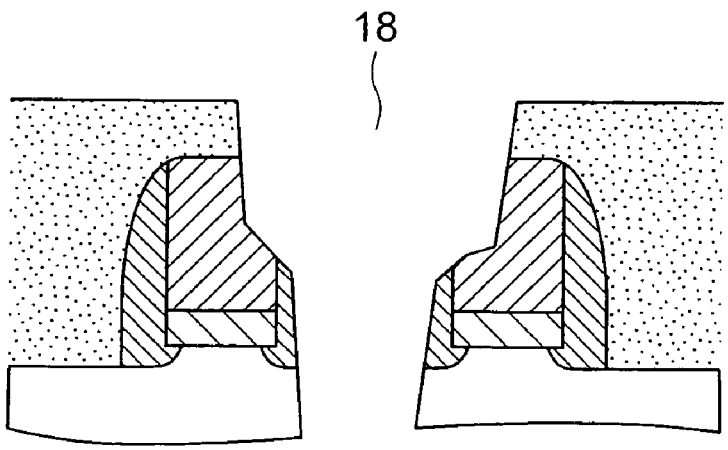
Figure 3A:
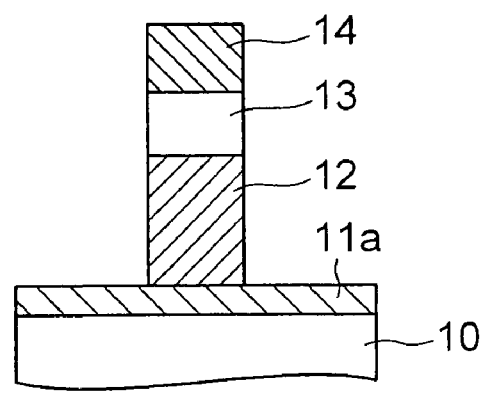
FIGS. 3A to 3E are sectional views of a semiconductor device during consecutive steps of a conventional fabrication process therefor.
Figure 3B:
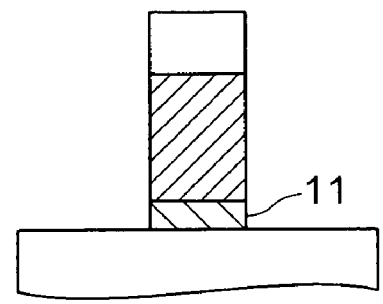
Figure 3C:
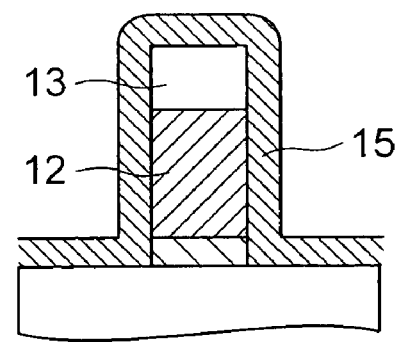
Figure 3D:
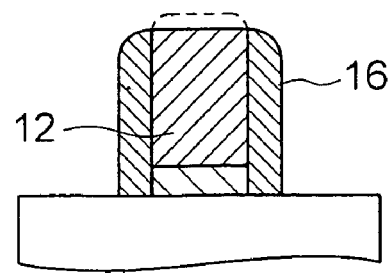
Figure 3E:
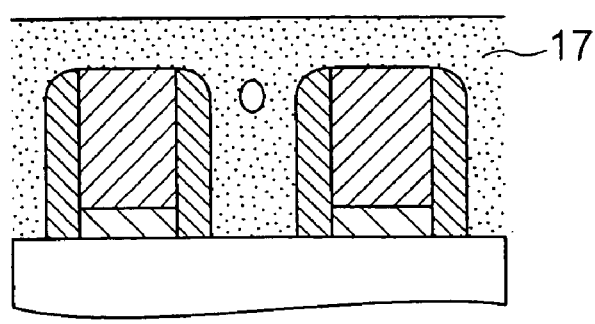
Figure 4A:
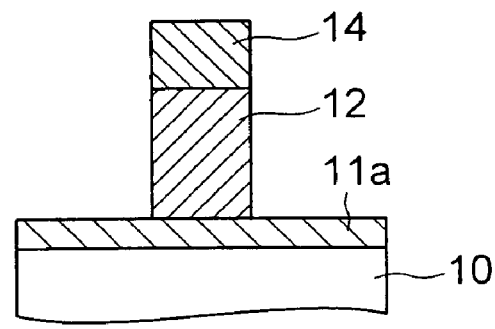
FIGS. 4A to 4F are sectional views of a semiconductor device during consecutive steps of another conventional fabrication process therefor.
Figure 4B:
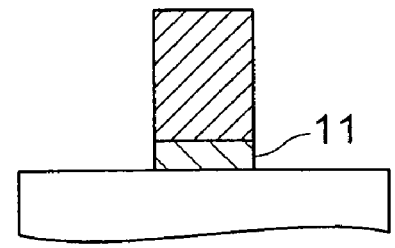
Figure 4C:
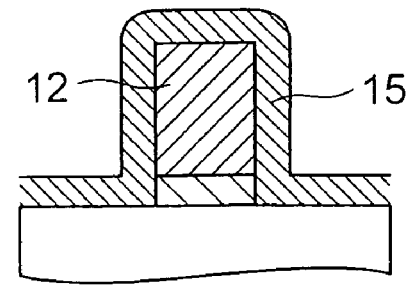
Figure 4D:
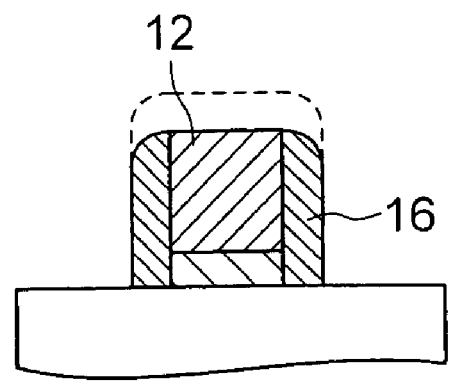
Figure 4E:
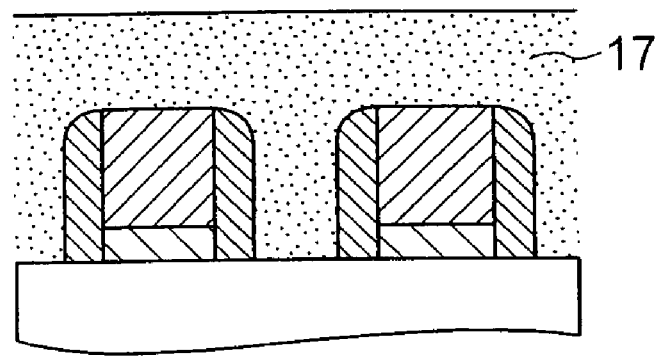
Figure 4F:
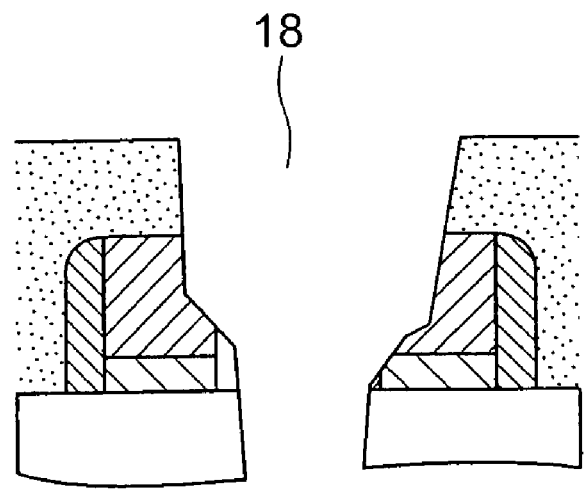

The insulator film 15 thus deposited is then etched-back to configure a side-wall oxide film 16, as shown in FIG. 2E. In the etch-back step, a portion of the oxide film 13 may be left on the insulator film 12. Subsequently, an interlayer dielectric film 17 is deposited over the entire area to embed therein the insulator film 12 and side-wall oxide film 16, as shown in FIG. 2F. A self-alignment etching step is then conducted to form a self-aligned contact hole 18 in the interlayer dielectric film 17 and the underlying oxide film 10 between the bit lines 12, as shown in FIG. 2G, followed by filling the contact hole 18 to form a capacitor contact.

In the present embodiment, although the surface portion of the underlying oxide film 10 is removed during the selecting etching of the oxide film 13, there are advantages that a larger etching margin is obtained during the self-alignment etching step for forming the contact hole 18 which is to receive therein the capacitor contact and that the interlayer dielectric film 17 less suffers from a defective embedding structure compared to the conventional technique.

Since the above embodiments are described only for examples, the present invention is not limited to the above embodiments and various modifications or alterations can be easily made therefrom by those skilled in the art without departing from the scope of the present invention. For example, the wet etching for the oxide film 13 as used in the step of FIG. 1B may be replaced by a dry etching, such as a sputter etching using argon gas, for reducing the width of the oxide film 13.

What is claimed is:

1. A method for fabricating a semiconductor device comprising, in consecutive order:
   depositing a metallic conductive film on an underlying insulating film;
   consecutively depositing first and second insulator films on said metallic conductive film;
   patterning said first and second insulator films to have a substantially same patterned area;
   etching said second insulator film selectively from said first insulator film to configure said second insulator film to have a bottom with a width smaller than a width of said first insulator film;
   patterning said metallic conductive film by using said first and second insulator films as an etching mask;
   subsequently depositing a third insulator film on said first insulator film, said etched second insulator film, and said underlying insulating film;
   etching-back said third insulator film to configure a side-wall film covering at least said patterned metallic conductive film; and
   depositing a fourth insulator film to embed therein said side-wall film on said underlying insulating film.

2. The method according to claim 1, wherein said etching-back configures said side-wall film to have a tapered mesa structure having a larger width toward a bottom thereof.

3. The method according to claim 1, further comprising, after depositing said fourth insulator film:
   etching said fourth insulator film to form therein a contact hole by using said side-wall film as an etch stopper; and
   forming a contact plug in said contact hole.

4. The method according to claim 1, wherein said first and second insulator films comprise a nitride film and an oxide film, respectively.

5. The method according to claim 1, wherein said semiconductor device comprises a semiconductor memory device.

6. The method of claim 1, wherein etching said second insulator film selectively from said first insulator film comprises wet etching said second insulator film.

7. A method for fabricating a semiconductor device comprising, in consecutive order:
   depositing a metallic conductive film on an underlying insulating film;
   consecutively depositing first and second insulator films on said metallic conductive film;
   patterning said first and second insulator films to have a substantially same patterned area;
   patterning said metallic conductive film by using said first and second insulator films as an etching mask;
   etching said second insulator film selectively from said first insulator film to configure said second insulator film to have a bottom with a width smaller than a width of said first insulator film;
   subsequently depositing a third insulator film on said first insulator film, said etched second insulator film, and said underlying insulating film;

etching-back said third insulator film to configure a sidewall film covering at least said patterned metallic conductive film; and depositing a fourth insulator film to embed therein said side-wall film on said underlying insulating film.

8. The method according to claim 7, wherein said etching-back configures said side-wall film to have a tapered mesa structure having a larger width toward a bottom thereof.

9. The method according to claim 7, further comprising, after depositing said fourth insulator film:

etching said fourth insulator film to form therein a contact hole by using said side-wall film as an etch stopper; and forming a contact plug in said contact hole.

10. The method according to claim 7, wherein said first and second insulator films comprise a nitride film and an oxide film, respectively.

11. The method according to claim 7, wherein said semiconductor device comprises a semiconductor memory device.

12. The method of claim 7, wherein etching said second insulator film selectively from said first insulator film comprises wet etching said second insulator film.

13. A method for fabricating a semiconductor device, the method comprising:

depositing a metallic conductive film on an insulating film;

depositing a first insulator film on said metallic conductive film;

depositing a second insulator film on said first insulator film;

patterning said first and second insulator films;

etching said second insulator film to have a patterned area that is smaller than said first insulator film;

patterning said metallic conductive film;

subsequently depositing a third insulator film on said first insulator film, said etched second insulator film, and said insulating film; and forming a sidewall film by etching said third insulator film.

14. The method of claim 13, wherein said etching of said second insulator film is performed before said patterning of said metallic conductive film.

15. The method of claim 13, wherein said etching of said second insulator film is performed after said patterning of said metallic conductive film.

16. The method of claim 13, wherein said patterning said metallic conductive film uses said first and second insulator films as an etching mask.

17. The method of claim 13, wherein said sidewall film covers at least said patterned metallic conductive film.

18. The method of claim 17, further comprising depositing a fourth insulator film on said sidewall film and said underlying insulating film.

19. The method of claim 18, further comprising etching said fourth insulator film to form a contact hole.

20. The method of claim 19, wherein etching said fourth insulator film uses said sidewall film as an etch stopper.

21. The method of claim 19, further comprising forming a contact plug in said contact hole.

22. The method of claim 13, wherein said sidewall film comprises a tapered mesa structure having a width larger at the bottom.

23. The method of claim 13, wherein said first insulator film comprises a nitride film.

24. The method of claim 13, wherein said second insulator film comprises an oxide film.

25. The method of claim 13, wherein said semiconductor device comprises a semiconductor memory device.

26. The method of claim 13, wherein etching said second insulator film comprises wet etching said second insulator film.

* * * * *